US007120051B2

(12) United States Patent
Gorobets et al.

(10) Patent No.: US 7,120,051 B2
(45) Date of Patent: Oct. 10, 2006

(54) PIPELINED PROGRAMMING OF NON-VOLATILE MEMORIES USING EARLY DATA

(75) Inventors: Sergey Anatolievich Gorobets, Edinburgh (GB); Yan Li, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 110 days.

(21) Appl. No.: 11/013,125

(22) Filed: Dec. 14, 2004

(65) Prior Publication Data

US 2006/0126390 A1    Jun. 15, 2006

(51) Int. Cl.
*G11C 11/34* (2006.01)
*G11C 16/04* (2006.01)
(52) U.S. Cl. .................... 365/185.02; 365/185.12; 365/185.17; 365/185.03; 365/185.22
(58) Field of Classification Search ............ 365/185.02, 365/185.12, 185.17, 185.03, 185.22
See application file for complete search history.

(56) References Cited

U.S. PATENT DOCUMENTS

| 5,274,646 | A  | 12/1993 | Brey et al. |
| 5,465,235 | A  | 11/1995 | Miyamoto |
| 5,734,816 | A  | 3/1998  | Niijima et al. |
| 5,822,245 | A  | 10/1998 | Gupta et al. |
| 5,862,099 | A  | 1/1999  | Gannage et al. |
| 5,890,192 | A  | 3/1999  | Lee et al. |
| 5,969,986 | A  | 10/1999 | Wong et al. |
| 6,021,463 | A  | 2/2000  | Belser |
| 6,040,997 | A  | 3/2000  | Estakhri |
| 6,266,273 | B1 | 7/2001  | Conley et al. |
| 6,282,624 | B1 | 8/2001  | Kimura et al. |
| 6,317,371 | B1 | 11/2001 | Katayama et al. |
| 6,330,185 | B1 | 12/2001 | Wong et al. |
| 6,374,337 | B1 | 4/2002  | Estakhri |
| 6,388,920 | B1 | 5/2002  | Katayama et al. |
| 6,421,279 | B1 | 7/2002  | Tobita et al. |

(Continued)

FOREIGN PATENT DOCUMENTS

EP    1280161 A1    1/2003

(Continued)

OTHER PUBLICATIONS

Notification of Transmittal of the International Search Report and the Written Opinion of the International Searching Authority, or the Declaration for International Application No. PCT/US2005/043020 mailed May 10, 2006, 9 pages.

(Continued)

*Primary Examiner*—Anh Phung
*Assistant Examiner*—Toan Le
(74) *Attorney, Agent, or Firm*—Parsons Hsue & de Runtz LLP

(57) ABSTRACT

The present invention presents techniques whereby a memory system interrupts a programming process and restarts it including additional data. More specifically, when a memory system programs data into a group of cells together as programming unit, programming can begin with less than the full data content which the group can hold. In one embodiment, the present invention allows overlapped programming of upper and lower data pages, where once the memory begins programming the lower logical data page, if data is received for the upper page assigned to the same physical page, programming is interrupted and recommenced with the concurrent programming of both the upper and the loser pages. In a complimentary embodiment, when a page contains multiple sectors of data, programming of the physical page can begin when one or more, but less than all, of the sectors forming the corresponding logical page have been received, stopped and restarted to include additional sectors of the page.

37 Claims, 12 Drawing Sheets

U.S. PATENT DOCUMENTS

| | | |
|---|---|---|
| 6,426,893 B1 | 7/2002 | Conley et al. |
| 6,449,625 B1 | 9/2002 | Wang |
| 6,456,528 B1 | 9/2002 | Chen |
| 6,490,649 B1 | 12/2002 | Sinclair |
| 6,522,586 B1 | 2/2003 | Wong |
| 6,525,952 B1 | 2/2003 | Araki et al. |
| 6,560,143 B1 * | 5/2003 | Conley et al. ......... 365/185.04 |
| 6,581,142 B1 | 6/2003 | Jacobs |
| 6,996,003 B1 * | 2/2006 | Li et al. ................ 365/185.02 |
| 2002/0126528 A1 | 9/2002 | Conley et al. |
| 2003/0065899 A1 | 4/2003 | Gorobets |
| 2003/0070036 A1 | 4/2003 | Gorobets |
| 2003/0099134 A1 | 5/2003 | Lasser et al. |
| 2003/0163629 A1 | 8/2003 | Conley et al. |

FOREIGN PATENT DOCUMENTS

| | | |
|---|---|---|
| JP | 5282883 | 10/1993 |
| JP | 11003290 | 11/1999 |
| WO | WO 00/49488 | 8/2000 |
| WO | WO 00/67137 | 11/2000 |
| WO | WO 02/49039 A2 | 6/2002 |
| WO | WO 02/058074 A2 | 7/2002 |
| WO | WO 03/029951 A2 | 4/2003 |
| WO | WO 03/069627 | 8/2003 |

OTHER PUBLICATIONS

Listing of Pending Claims for International Application No. PCT/US2005/043020, 7 pages.

Notification of Transmittal of the Internatioanal Search Report and the Written Opinion of the International Searching Authority, or the Declaration for International Application No. PCT/US2005/016341 mailed Oct. 19, 2005, 12 pages.

Nakamura et al., "A Novel Sense Amplifier for Flexible Voltage Operation NAND Flash Memories," 1995 *Symposium on VLSI Circuits Digest of Technical Papers*, Jun. 8-10, 1995, pp. 71-72.

Srisa-an et al., "Performance Enhancements to the Active Memory System," *2002 IEEE International Conference on Computer Design: VLSI in Computers and Processors*, Sep. 16-18, 2002, pp. 249-256.

Lee et al., "High-Perfromance 1-Gb NAND Flash Memory with 0.12-μm Technology," *Journal of Solid-State Cicuits*, Nov. 2002, vol. 37, No. 11, pp. 1502-1509.

Imamiya et al., "A 125-mm$^2$ 1-GB NAND Flash Memory with 10/Mbyte/s Program Speed," *IEEE Journal of Solid State Circuits*, vol. 37, No. 11, Nov. 2002, pp. 1493-1501.

* cited by examiner

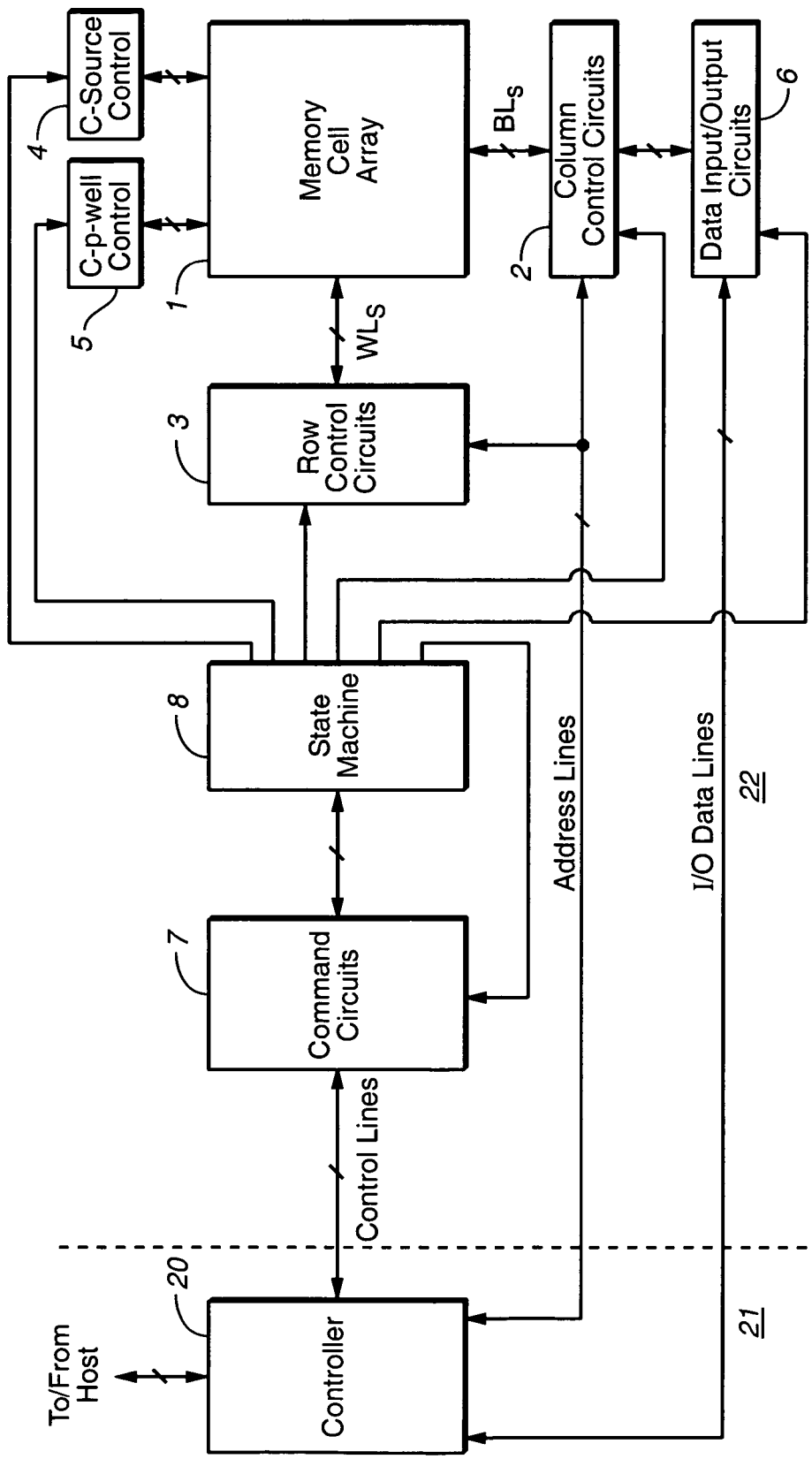
FIG._1
(PRIOR ART)

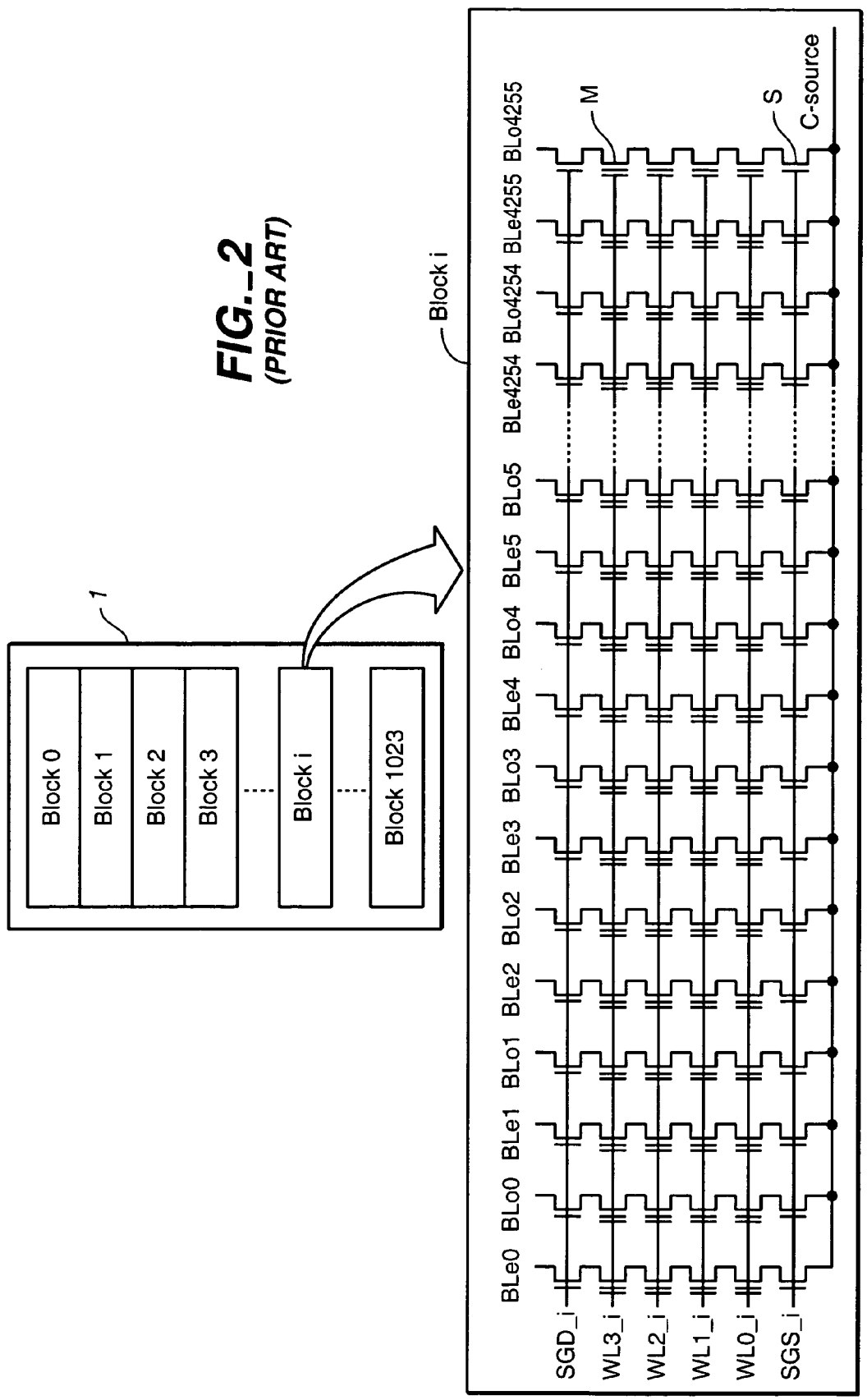
FIG._2 (PRIOR ART)

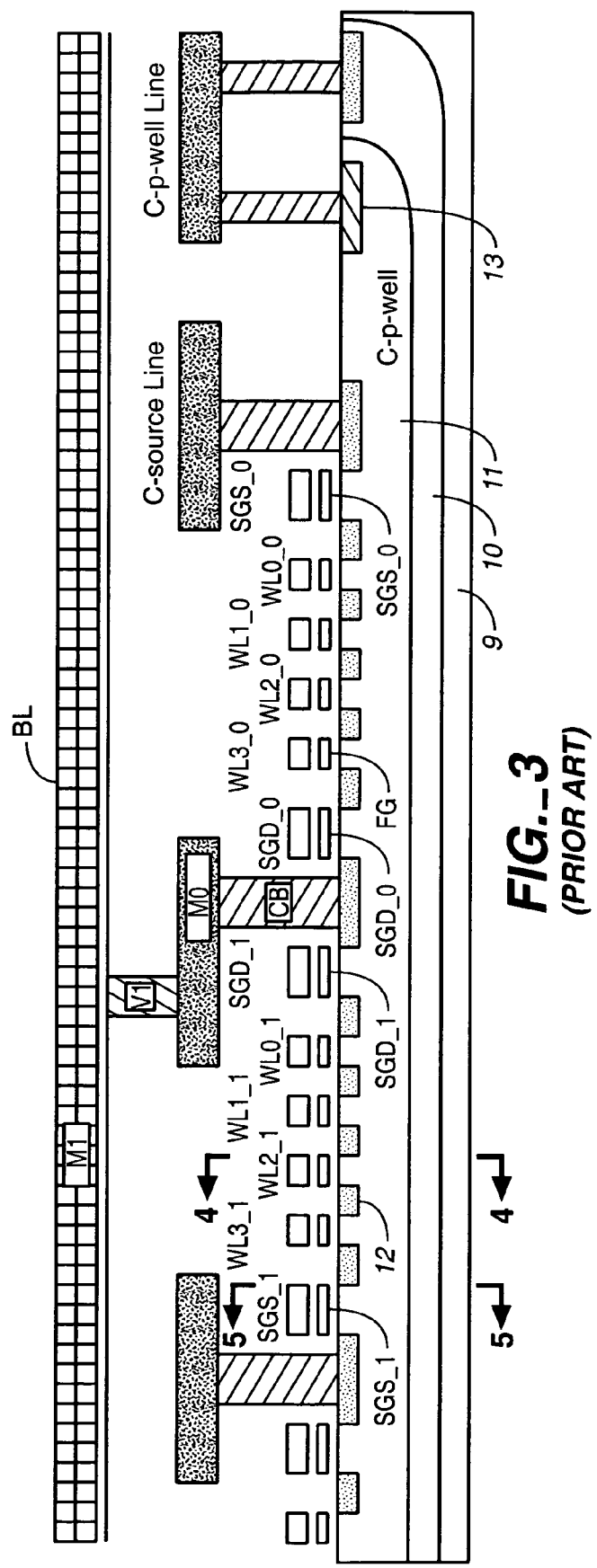
FIG._3
*(PRIOR ART)*

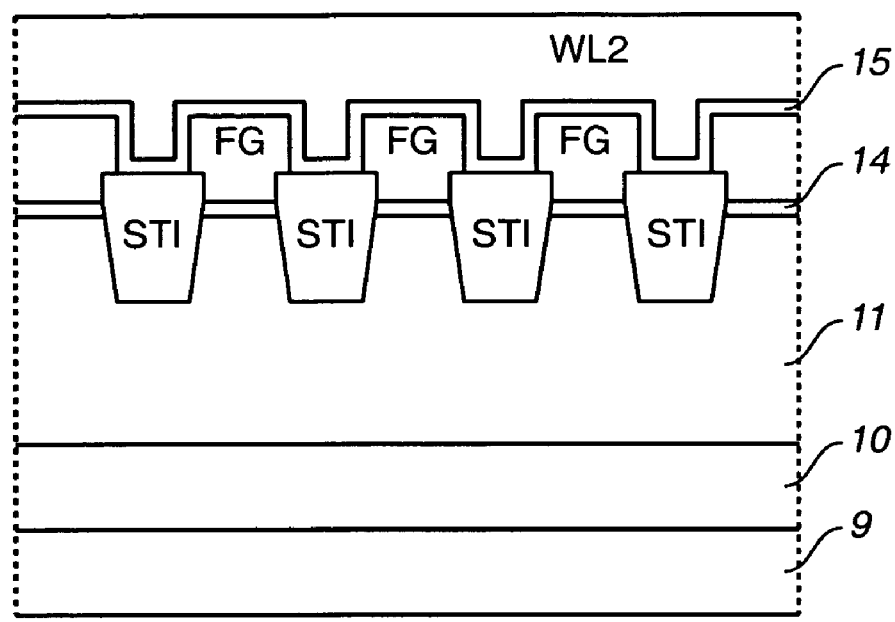
FIG._4
*(PRIOR ART)*
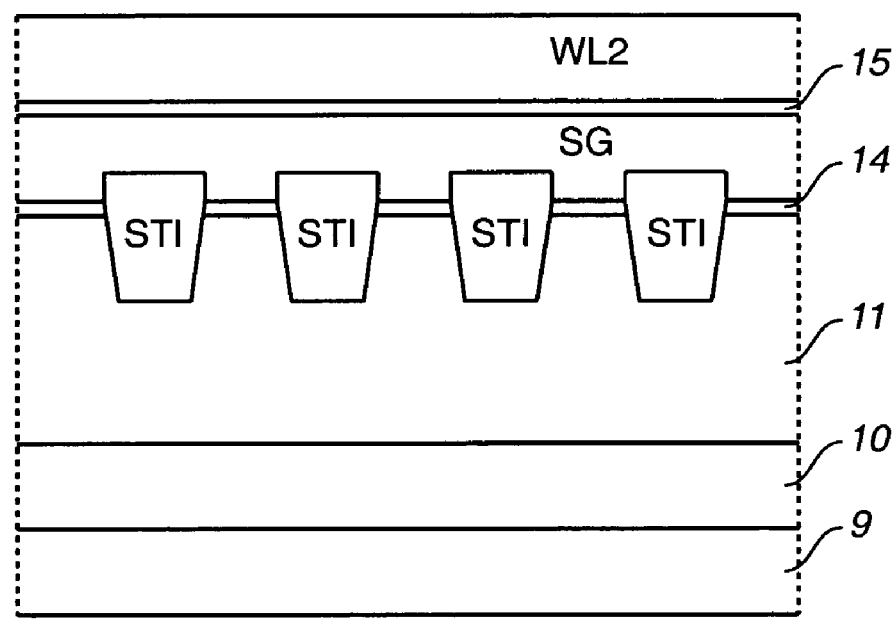
FIG._5
*(PRIOR ART)*

| | Erase | Program Promotion | Program Inhibition | Read10 | Read10 for 1st Pass | Read10 for 2nd Pass | Read00 | Read00 for 2nd Pass | Read01 | Verify10 for 1st Pass | Verify10 for 2nd Pass | Verify00 for 1st Pass | Verify00 for 2nd Pass | Verify01 |
|---|---|---|---|---|---|---|---|---|---|---|---|---|---|---|
| BLe | Floating | 0V | Vdd | H or L | H or L | H or L | H or L | H or L | H or L | H or L | H or L | H or L | H or L | H or L |
| BLo | Floating | Vdd | Vdd | 0V | 0V | 0V | 0V | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V | 4.5V | 4.5V | 4.5V | 4.5V |
| WL2 | 0V | Vpgm | Vpgm | 0V | 0V | 0V | 1V | 1V | 2V | 0.2V | 0.4V | 1.2V | 1.4V | 2.4V |
| WL1 | 0V | 10V | 10V | 4.5V | 4.5V | 4.5V | 4.5V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V | 4.5V | 4.5V | 4.5V | 4.5V |
| SGS | Floating | 0V | 0V | 4.5V | 4.5V | 4.5V | 4.5V | 4.5V | 4.5V | 4.5V | 4.5V | 4.5V | 4.5V | 4.5V |
| C-source | Floating | 0V | 0V | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V | 0V | 0V |

FIG._6
*(PRIOR ART)*

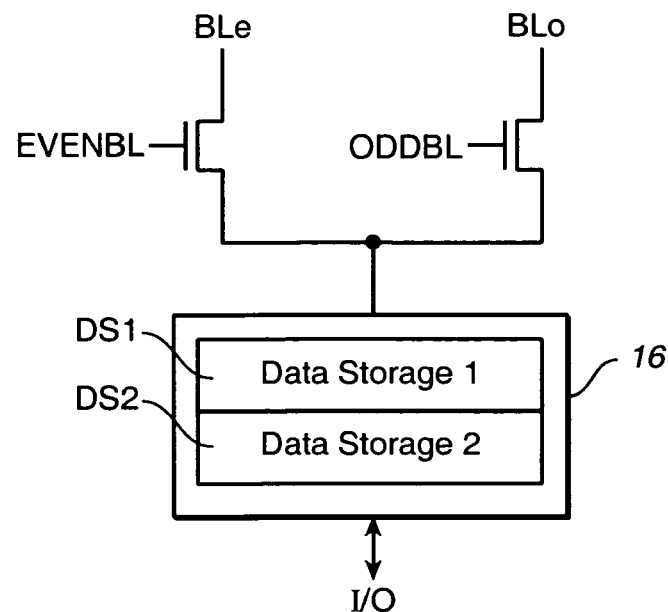
FIG._7
*(PRIOR ART)*
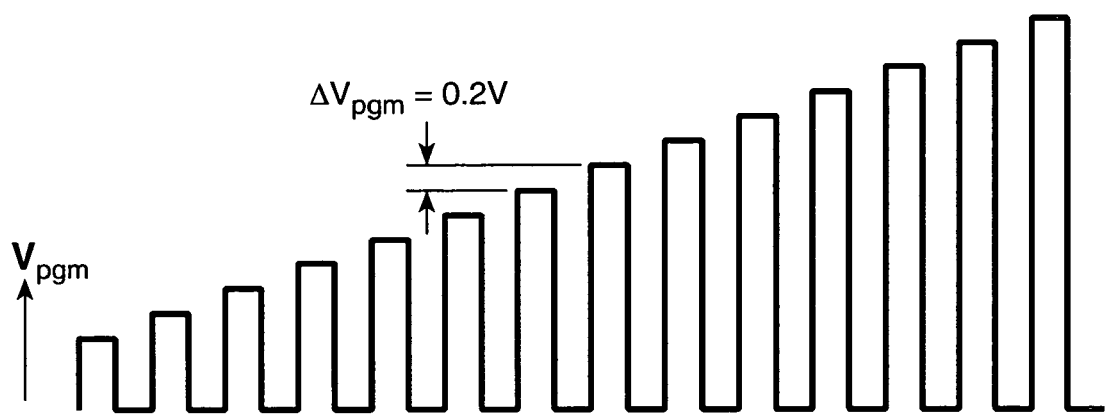
FIG._9
*(PRIOR ART)*

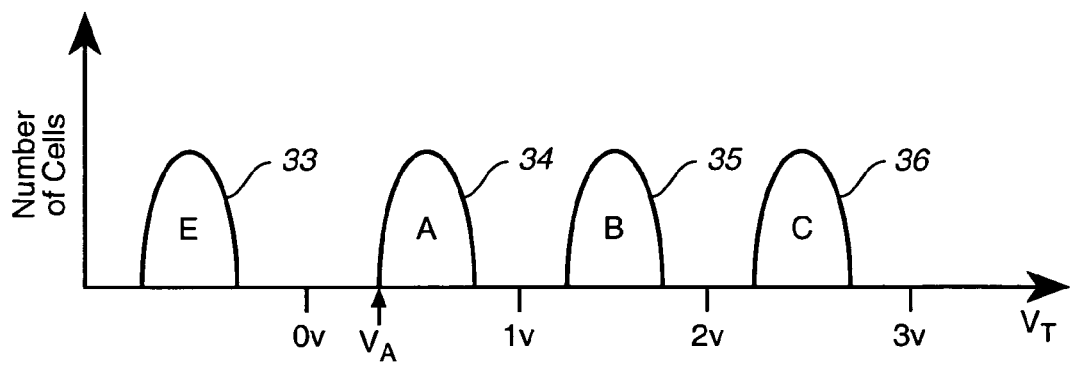
FIG._8A (PRIOR ART)
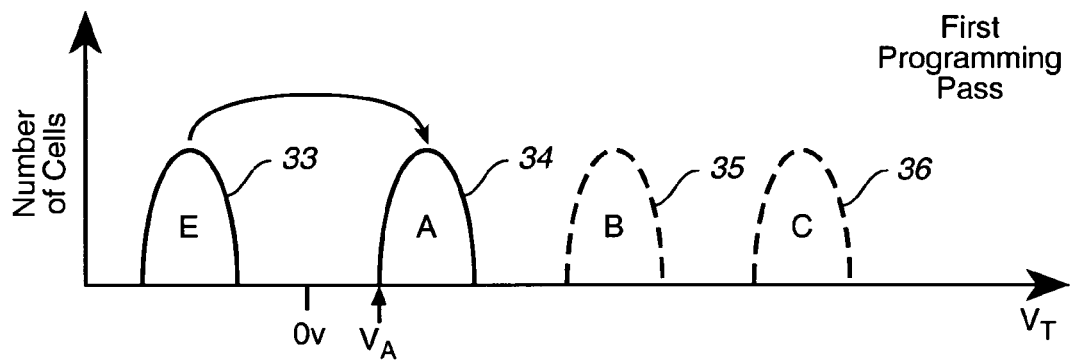
FIG._8B (PRIOR ART)
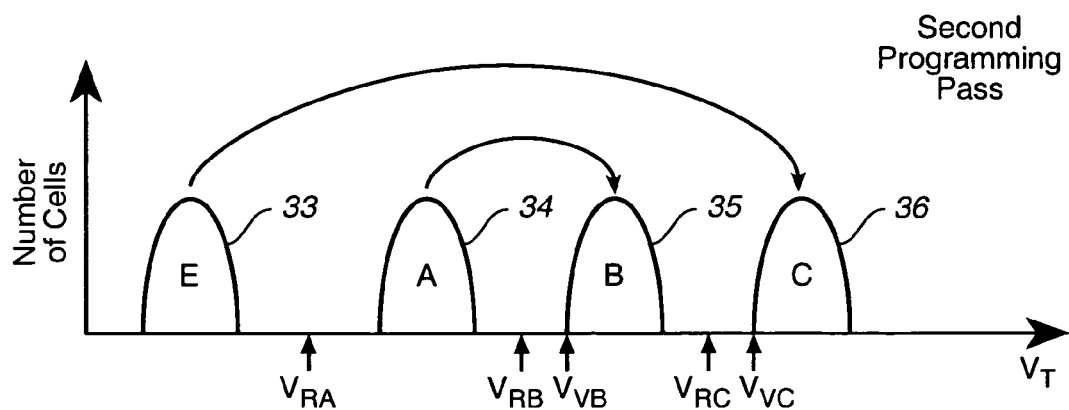
FIG._8C (PRIOR ART)

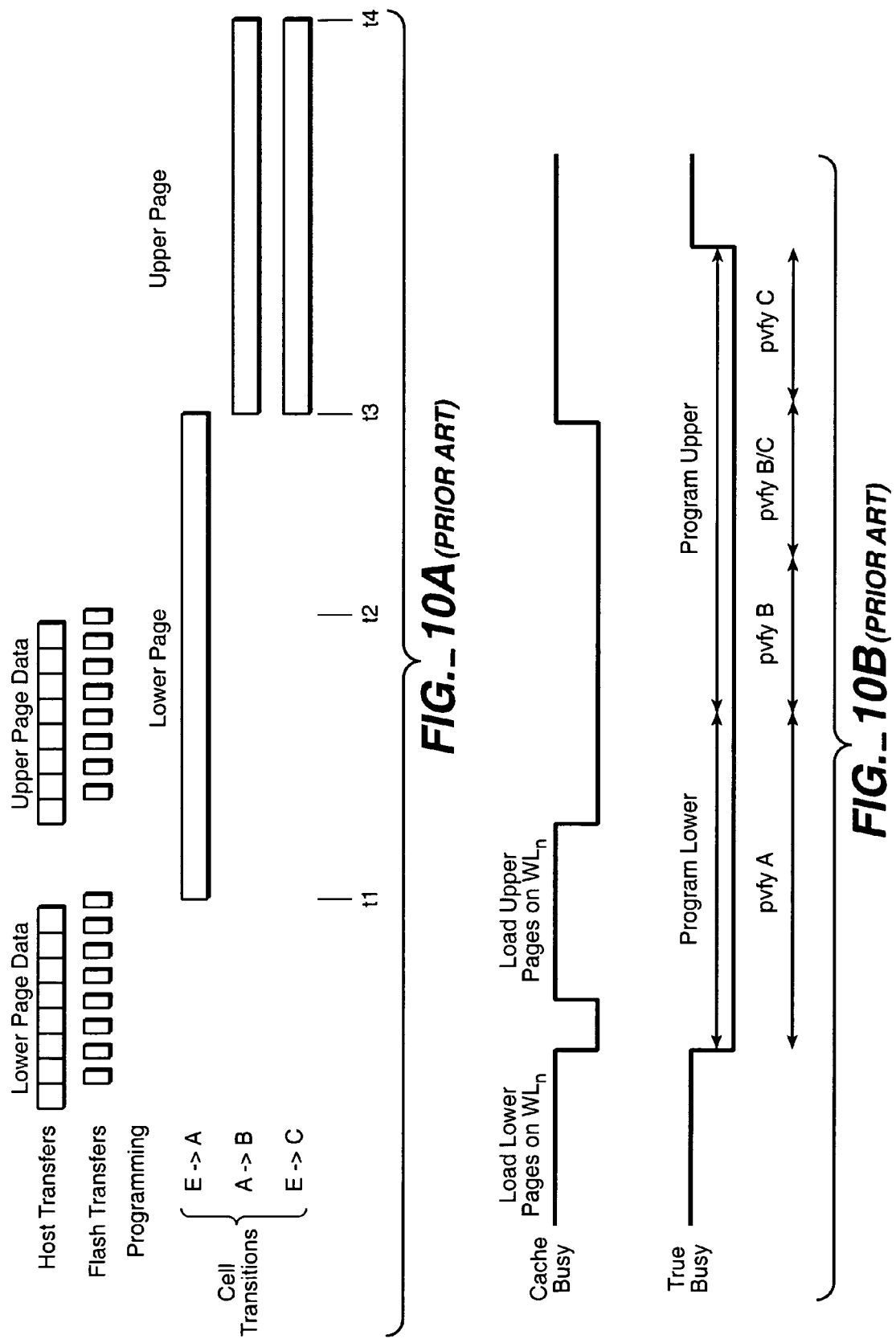
FIG._10A (PRIOR ART)
FIG._10B (PRIOR ART)

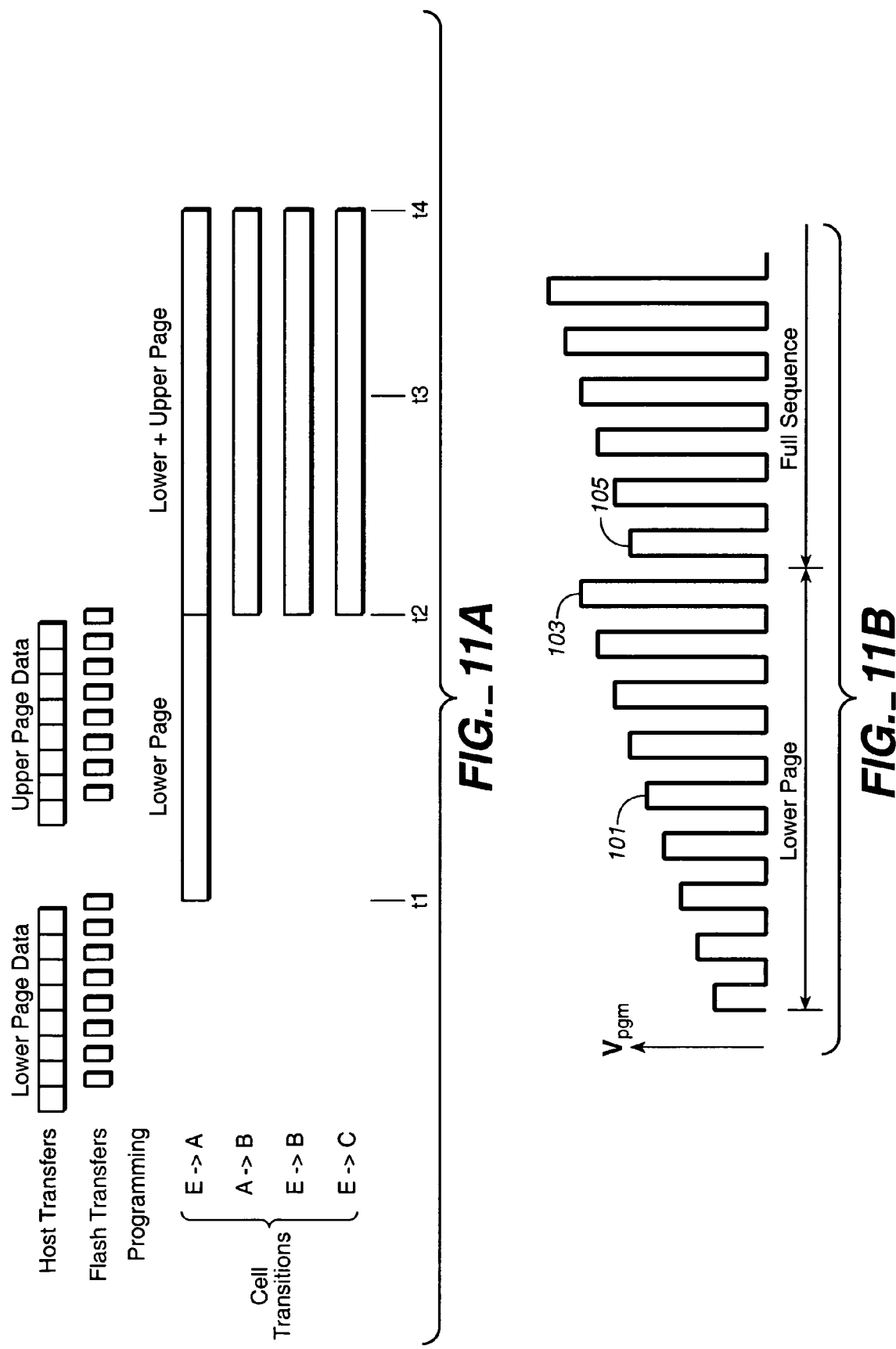
FIG._11A
FIG._11B

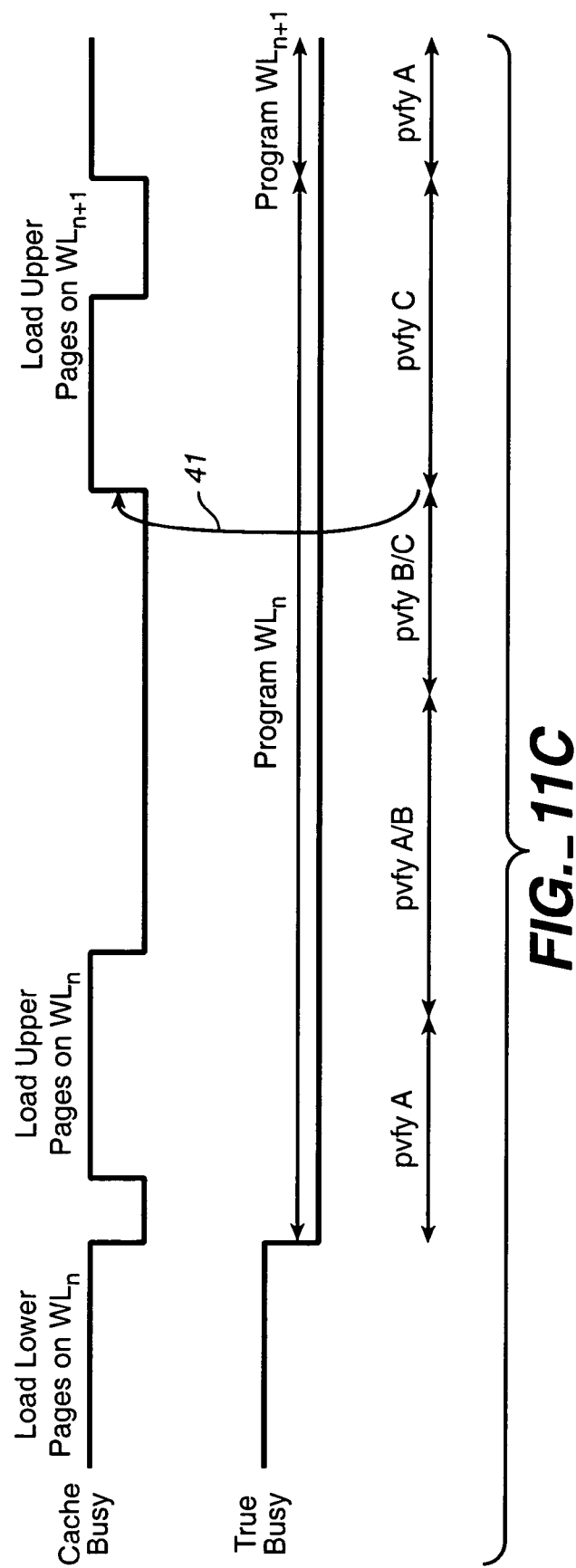
FIG._11C

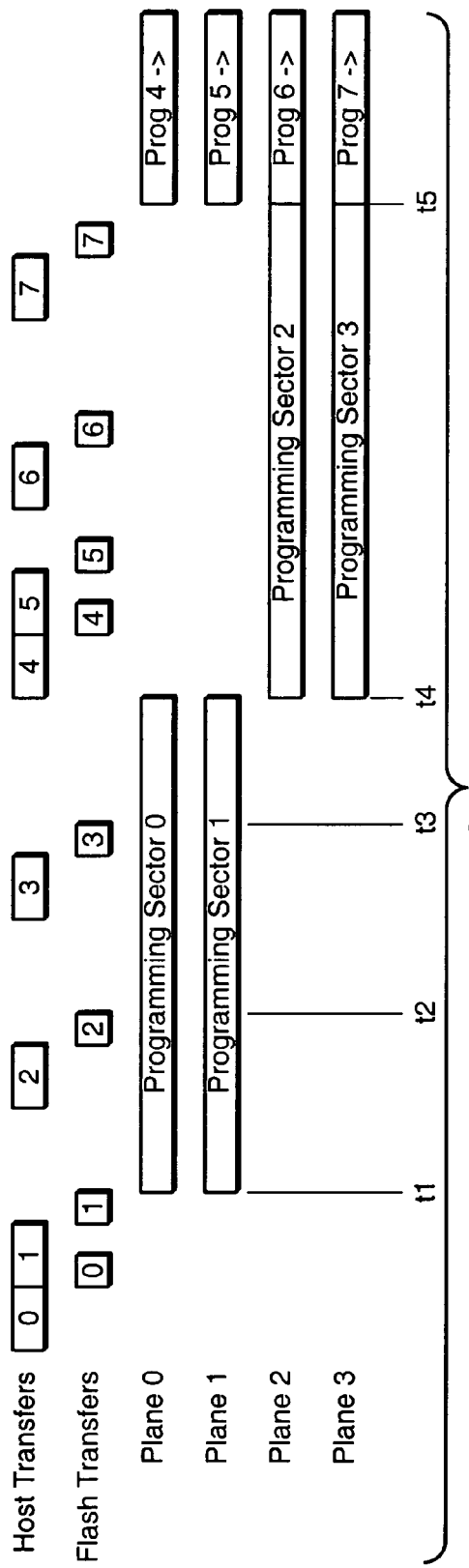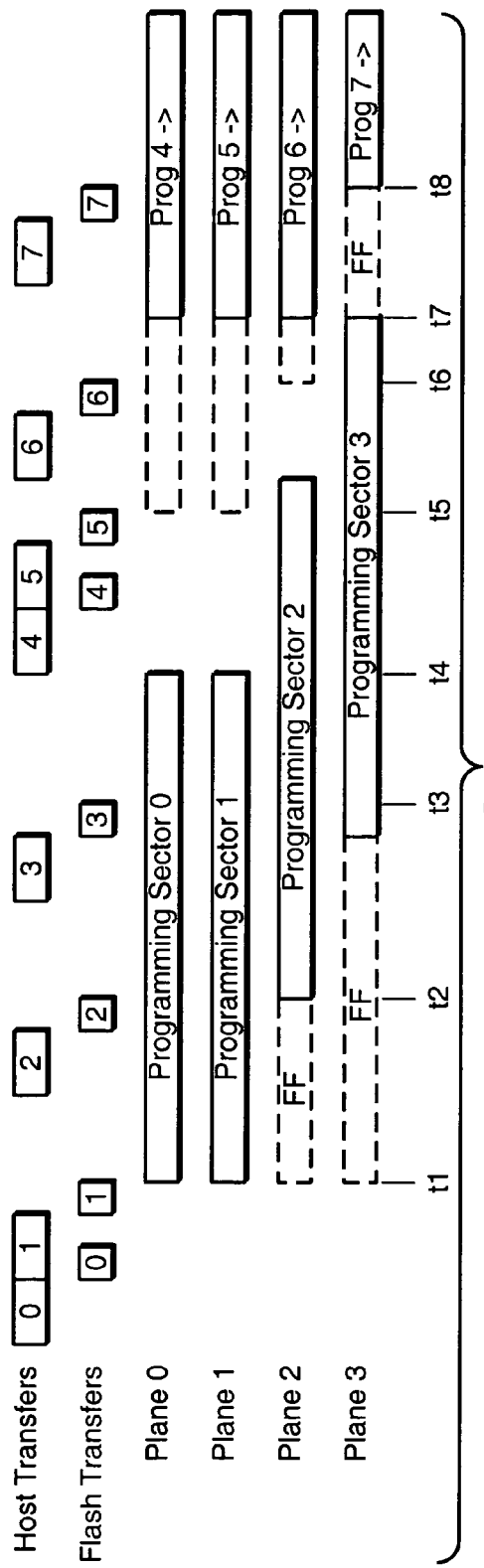

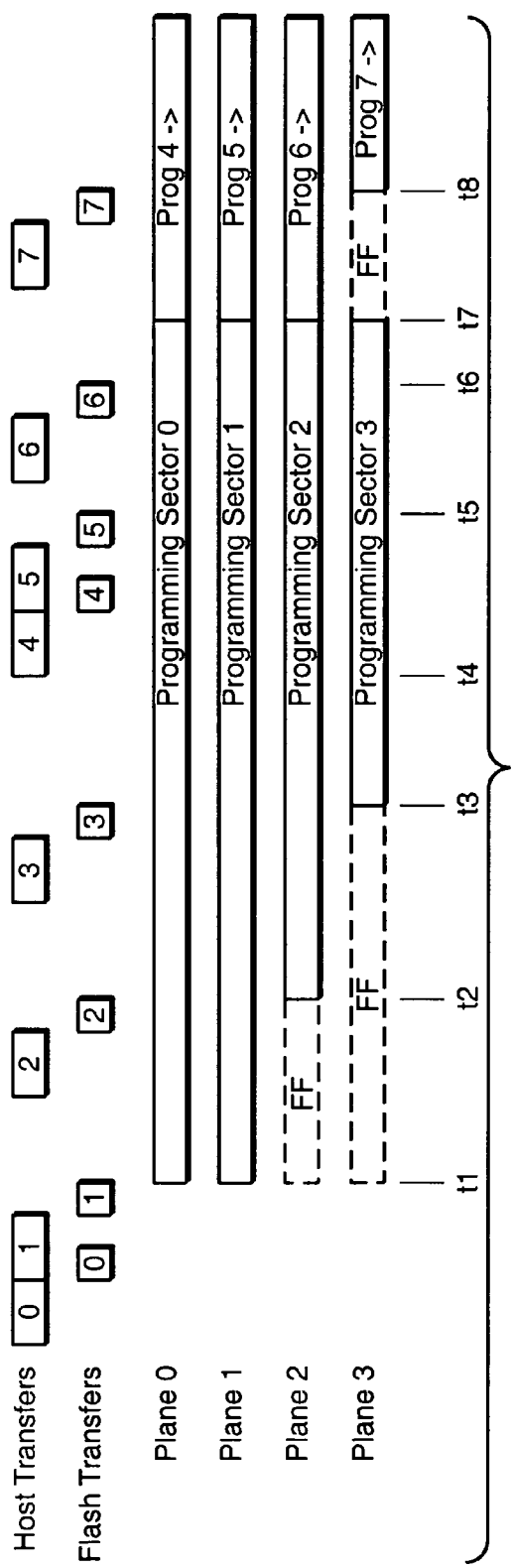
FIG._14A
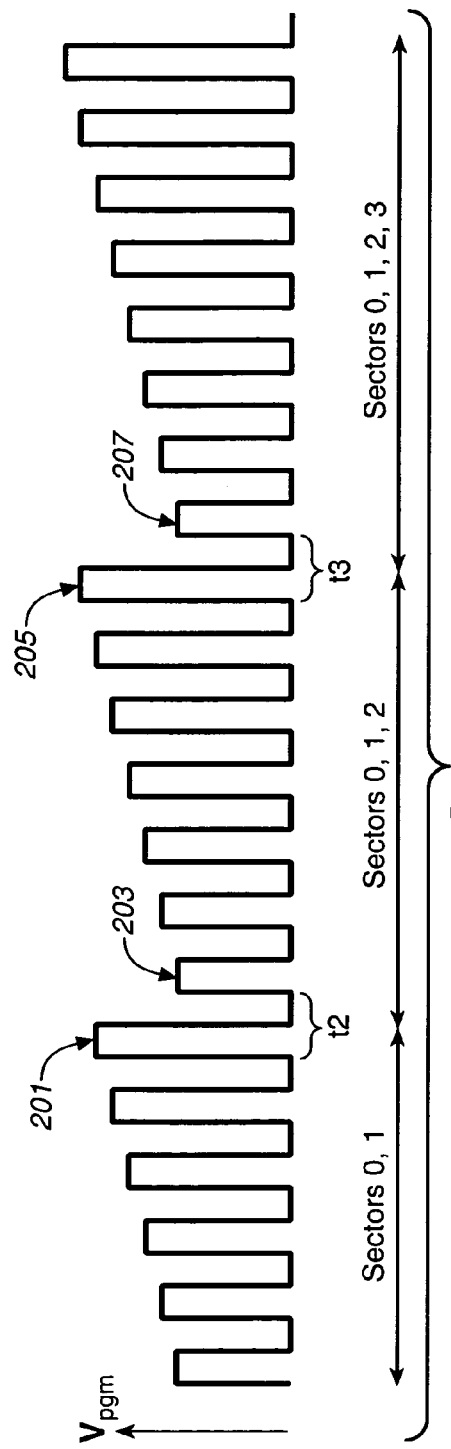
FIG._14B

PIPELINED PROGRAMMING OF NON-VOLATILE MEMORIES USING EARLY DATA

FIELD OF THE INVENTION

This invention relates generally to a non-volatile memory and its operation, and, more specifically, to techniques for improving the programming speed of multi-state memories when complete data is not initially present at the time programming is initiated.

BACKGROUND OF THE INVENTION

The principles of the present invention have application to various types of non-volatile memories, those currently existing and those contemplated to use new technology being developed. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate storage element) now being included in commercial products. More storage states, such as 16 states per storage element, are contemplated. Each floating gate memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the floating gate storage elements decreases. Since the ranges of charge designated for each storage state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual shifts in the charge stored in one cell can be disturbed when reading, programming and erasing other cells that have some degree of electrical coupling with that cell, such as those in the same column or row, and those sharing a line or node.

Apparent shifts in the stored charge occur because of field coupling between storage elements. The degree of this coupling is necessarily increasing as the sizes of memory cell arrays are being decreased and as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appear to be different than programmed because of the effect of the charge on the second set of floating gates being coupled with the first. This is described in U.S. Pat. Nos. 5,867,429 and 5,930,167, which patents are incorporated herein in their entirety by this reference. These patents describe either physically isolating the two sets of floating gates from each other, or taking into account the effect of the charge on the second set of floating gates when reading that of the first. Further, U.S. Pat. No. 5,930,167 describes methods of selectively programming portions of a multi-state memory as cache memory, in only two states or with a reduced margin, in order to shorten the time necessary to initially program the data. This data is later read and re-programmed into the memory in more than two states, or with an increased margin.

This effect is present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. Nos. 09/505,555, filed Feb. 17, 2000, and Ser. No. 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patents that are incorporated herein in their entirety by this reference: U.S. Pat. Nos. 5,570,315, 5,774,397 and 6,046,935. Briefly, two bits of data, often from different logical pages of incoming data are programmed into one of four states of the individual cells in two steps, first programming a cell into one state according to one bit of data and then, if the data makes it necessary, re-programming that cell into another one of its states according to the second bit of incoming data.

As described in these patents, a common technique for encoding the data stored in these multi-state (or MLC) memories is to both store an upper page of data and a lower page of data in the same set of multi-level cells. This arrangement has the shortcoming, that if a physical page of MLC flash memory is being programmed with the lower page data, the user (controller) has to wait until the programming is finished to be able to start programming the upper page data, when, in fact, both the lower and upper page data are going to be programmed into the same physical page. It is also common in these designs to write data in a page containing an amount of data corresponding to multiple units of data transfer. This results in the shortcoming that if a flash memory is being partially programmed, as when a multi-sector or multi-plane page is programmed with, say, only a single sector of data, the user (controller) has to wait until programming is finished to be able to start another partial program of the same page. The performance of non-volatile memory systems could be improved if these shortcomings could be reduced or eliminated.

SUMMARY OF THE INVENTION

Briefly and generally, the present invention presents techniques whereby a memory system interrupts a programming process and restarts it including additional data. More specifically, when a memory system programs data into a group of cells together as programming unit, programming can begin with less than the full data content which the group can hold. If additional data assigned to the group arrives while programming is in progress, the programming is interrupted and the current state of the memory cells is determined. The additional data is then incorporated into the data being programmed and programming resumes, until completion or until even more additional data assigned to the group arrives on the memory. This allows performance to be increased since programming of the additional data can begin as it arrives, rather than waiting until the partial content programming in process completes.

In a sub-aspect of the present invention, the present invention allows overlapped programming of upper and lower data pages. In a multi-state system using multi-pass programming, the lower logical data page assigned to physical page of the memory begins programming. Once the upper logical data page assigned to the same physical page is transferred to the memory, the programming of the lower page is interrupted and the status of the lower page programming is established. The memory than converts to a multi-state programming mode to write the upper and lower page data concurrently. This allows the lower page data to start programming as soon as it is available, without having to wait for an associated upper page. It also allows the upper page to begin programming as soon as it is available, without waiting for the first programming pass to finish writing in the lower page.

In another sub-aspect of the present invention, programming to a physical page can start once data that has been assigned to a given physical page has been transferred, even if corresponds to less than the full complement of planes that make up the page. For example, when a page contains multiple sectors of data, programming of the physical page can begin when one or more, but less than all, of the sectors forming the corresponding logical page have been received. Once the partial page programming begins, should additional data (e.g. additional sectors) assigned to the page being programmed be transferred to the memory, the partial page programming is interrupted and the status of the partial page is established. The memory then adds the additional data to the write and restarts programming. This allows the first transferred data to start programming as soon as it is available, without having to wait for any additional data needed to complete the page. It also allows the additional data to begin programming once it is transferred, without waiting for the partial page programming of the initially transferred portion of the page to finish writing, resulting in a pipelined partial page programming process. Additionally, the physical page can be distributed across multiple planes of the memory.

A specific embodiment of these aspects uses a staircase programming waveform. When the additional data is received, the level of the staircase and other associated parameters may need to be reset depending upon the progression of programming to that point.

Additional aspects, features, advantages and applications of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIG. 2 illustrates an existing circuit and organization of the memory array of FIG. 1 when the memory cell array is of a NAND type;

FIG. 3 shows a cross-sectional view, along a column, of a NAND type memory array formed on a semiconductor substrate;

FIG. 4 is a cross-sectional view of the memory array of FIG. 3, taken at section 4—4 thereof;

FIG. 5 is a cross-sectional view of the memory array of FIG. 3, taken at section 5—5 thereof;

FIG. 6 provides Table 1 of example operating voltages of the NAND memory cell array of FIGS. 2–5;

FIG. 7 illustrates another feature of the NAND memory cell array of FIGS. 2–5;

FIG. 8A shows an example existing distribution of threshold voltages of the NAND memory cell array of FIGS. 2–5 when operated in four states;

FIGS. 8B and 8C are voltage threshold level distributions that illustrate a multi-state technique for programming the memory cell array of FIGS. 2–5;

FIG. 9 shows an example programming voltage signal that may be used in the memory cell array of FIGS. 2–5;

FIGS. 10A and 10B represent the programming of upper and lower MLC pages as executed in the prior art;

FIGS. 11A–11C represents a first embodiment of a process for overlapping the programming of upper and lower MLC pages;

FIG. 12 represent partial page programming as could be executed in the prior art;

FIG. 13 illustrates a first embodiment of a pipelined partial page programming process; and FIGS. 14A and 14B illustrates a second embodiment of a pipelined partial page programming process.

DESCRIPTION OF EXEMPLARY EMBODIMENTS

Example Non-Volatile Memory System

With reference to FIGS. 1–7, a specific non-volatile memory system is described in which the various aspects of the present invention are implemented, in order to provide definite examples. FIG. 1 is a block diagram of a flash memory system. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (labeled as "c-p-well" 11 in FIG. 3) on which the memory cells (M) are formed. The c-source control circuit 4 controls a common source line (labeled as "c-source" in FIG. 2) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 2, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit or NAND string. One terminal of the NAND cell unit is connected to corresponding bit line (BL) via a first select transistor which gate electrode is coupled to a first select gate line (SGD), and another terminal is connected to the c-source via a second select transistor which gate electrode is coupled to a second select gate line (SGS). Although four floating gate transistors are shown to be included in each cell unit for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously and this unit of data is referred to as a page. Since in this example each NAND string contains 4 cells and there are two bit lines per sense amp, one block can store at least eight pages. When each memory cell (M) stores two bits of data, namely a multi-level cell, one block stores 16 pages. In this embodiment, the storage element of each of the memory cells, in this case the floating gate of each of the memory cells, stores two bits of user data.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

Each memory cell has a floating gate (FG) that stores an amount of charge corresponding to the data being stored in the cell, the word line (WL) forming the gate electrode, and drain and source electrodes made of the n-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4—4 of FIG. 3) and a select transistor (section 5—5 of FIG. 3), respectively, in the direction of the word line (WL2). Each column is isolated from the neighbor columns by a trench formed in the substrate and filled with isolation material, known as shallow trench isolation (STI). The floating gates (FG) are isolated from each other by the STI and insulator film 15 and word line (WL). The space between the floating gates (FG) may be of the order of 0.1 um, and the capacitive coupling between the floating gates may be significant. Since the gate electrode (SG) of the select transistor is formed in the same formation process steps as the floating gate (FG) and word line (WL), it shows a stacked gate structure. These two select gate lines (SG) are electrically shorted together at the end of the word lines.

Table I of FIG. 6 summarizes voltages applied to operate the memory cell array 1, in a specific example, each memory cell's floating gate storing two bits, having one of the states "11", "10", "01", "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to almost 20V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to a positive voltage Vdd, for example 3V, as well as all of the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential of a cell that is being inhibited is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01, or "00". Various other coding schemes may be selected to represent these states so that the designation E (erase), A (lowest threshold program state), B (threshold higher than A), and C (highest threshold program state) will be used in the subsequent discussion.

In the read and verify operations, the select gates (SGD and SGS) and the unselected word lines (WL0, WL1 and WL3) are raised to a read pass voltage of 4.5V to insure that current between the bit line and common source line can pass through them. The selected word line (WL2) is connected to a voltage, a level of which is specified for each read and verify operation in order to determine whether a threshold voltage of the concerned memory cell has reached such level. For example, in a READ 10 operation (state A), the selected word line WL2 is grounded, so that it is detected whether the threshold voltage is higher than 0V. In this read case, it can be said that a read level is 0V. In a VERIFY01 operation (state C), the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M). Further details of the read and verify operations are explained below.

FIG. 7 shows a part of the column control circuit 2 of FIG. 1. Each pair of bit lines (BLe and BLo) is coupled to a data storage portion 16 which includes two data storage (DS1 and DS2) registers, each being capable of storing one bit of data. The data storage portion 16 senses the potential level of the selected bit line (BL) during a read or verify operation and then stores the data in a binary manner, and controls the bit line voltage in the program operation. The data storage portion 16 is selectively connected to the selected bit line (BL) by selecting one of signals of "EVENBL" and "ODDBL". The data storage portion 16 is also coupled to the I/O line to output the read data and to store the program data. The I/O line is connected to the data input/output buffer 6, as described above with respect to FIG. 1.

Operation of the Memory System With More Than Two States per Storage Element

FIG. 8A illustrates threshold voltage distributions for the memory cell array 1 when each floating gate storage element stores two bits of data, namely four data states, in each memory cell (M). The curve 33 represents a distribution of the threshold levels $V_T$ of the cells within the array 1 that are in the erased state (E data state), being negative threshold voltage levels. Threshold voltage distributions 34 and 35 of memory cells storing A and B user data, respectively, are shown to be between 0V and 1V and between 1V and 2V. A curve 36 shows the distribution of cells that have been programmed to the C data state, being the highest threshold voltage level set more than 2V and less than 4.5V of the read pass voltage.

Each of the two bits stored in a single memory cell (M), in this example, is from a different logical page. That is, each bit of the two bits stored in each memory cell carries a different logical page address from the other. The lower page bit shown in FIG. 8A is accessed when an even page address (=0, 2, 4, . . . , N/2) is input where N is the logical page capacity of the memory. The upper page bit is accessed when an odd page address (=1, 3, 5, . . . , [N/2]+1) is input. Using the example coding shown in FIG. 8A, state E can be represented as the "11" state, state A as the "10" state, state B as the "00" state, and state C as the "01" state, where the first binary digit represents the value stored in the upper page and the second binary digit represents the value stored in the lower page.

In order to provide improved reliability, it is better for the individual distributions to be tightened (the threshold distribution narrowed), because the tighter distribution results in a wider read margin (distance between them). According to the present invention, the distribution width remains tighter without a conspicuous degradation in the programming speed.

According to the article "Fast and Accurate Programming Method for Multi-level NAND EEPROMs", *Digest of* 1995 *Symposium on VLSI Technology*, pp 129–130, which article is incorporated herein by this reference, in principle, limiting a distribution to a 0.2V-width requires that the usual repetitive programming pulses be incremented 0.2V between steps. FIG. 9 shows an existing programming pulse technique. A programming voltage Vpgm waveform is illustrated. The programming voltage Vpgm is divided into many pulses, and increased 0.2V pulse by pulse. The starting level of Vpgm is 12V, in this particular example.

In periods between the pluses, the verify (read) operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, programming is stopped or inhibited for that bit by raising the voltage of the bit line to which the series cell unit of the given cell is connected from 0V to Vdd. Programming of others of the cells being programmed in parallel on the same page continues until they in turn reach their verify levels. When the threshold voltage moves from below the verify level to above it during the cell's last programming pulse, the shift of the threshold voltage is equal to the Vpgm step size of 0.2V. Therefore, the threshold voltages are controlled within a 0.2V-width.

FIGS. 8B and 8C illustrate a specific existing technique of programming a 4-state NAND memory cell in an array of the type described above. In a first programming pass, the cell's threshold level is set according to the bit from the lower logical page. If that bit is a "1", nothing is done since it is in that state as a result of having been earlier erased. However, if that bit is a "0", the level of the cell is increased to the A programmed state 34 using $V_{VA}$ as the verify voltage to inhibit further programming. That concludes the first programming pass.

In a second programming pass, the cell's threshold level is set according to the bit being stored in the cell from the upper logical page. If a "1", no programming occurs since the cell is in one of the states 33 or 34, depending upon the programming of the lower page bit, both of which carry an upper page bit of "1". If the upper page bit is a "0", however, the cell is programmed a second time. If the first pass resulted in the cell remaining in the erased or E state 33, the cell is programmed from that state to the highest threshold state 36 (state C), as shown by the upper arrow FIG. 8C and $V_{VC}$ is used as the verify condition to inhibit further programming. If the cell has been programmed into the state 34 (state A), as a result of the first programming pass, the cell is further programmed in the second pass from that state to the state 35 (state B) using $V_{VB}$ as the verify condition, as shown by the lower arrow of FIG. 8C. The result of the second pass is to program the cell into the state designated to store a "0" from the upper page without changing the logical value written during the first pass programming. During this second programming cycle, the threshold distribution of a cell can remain in state E or A, or shift into either state B or C. Since there are two different target threshold states occurring in different cells simultaneously during the same programming cycle, two different verify levels, $V_{VB}$ and $V_{VC}$, must be checked after each programming pulse. In some systems $V_{VC}$ may be checked only during the later voltage pulses in order to speed up the total program cycle.

Of course, if the memory is operated with more than four states, there will be a number of distributions within the defined voltage threshold window of the memory cells that is equal to the number of states. Further, although specific bit patterns have been assigned to each of the distributions, different bit patterns may be so assigned, in which case the states between which programming occurs can be different than those shown in FIGS. 8B and 8C. A few such variations are discussed in the patents previously referenced in the Background for NAND systems. Further, techniques for reducing the consequences of adjacent cell coupling in NAND and other types of memory arrays that are operated in multiple states are described in U.S. Pat. No. 6,522,580, which is also incorporated herein in its entirety by this reference.

The voltages $V_{RA}$, $V_{RB}$ and $V_{RC}$, positioned roughly halfway between adjacent ones of the distributions 33–36, are used to read data from the memory cell array. These are the threshold voltages with which the threshold voltage state of each cell being read is compared. This is accomplished by comparing a current or voltage measured from the cell with reference currents or voltages, respectively. Margins exist between these read voltages and the programmed threshold voltage distributions, thus allowing some spreading of the distributions from disturbs and the like, as discussed above, so long as the distributions do not overlap any of the read voltages $V_{RA}$, $V_{RB}$ and $V_{RC}$. As the number of storage state distributions increases, however, this margin is reduced and the programming is then preferably carried out with more precision in order to prevent such spreading.

The previous description assumes that two logical pages reside in one physical page and that only the lower logical page or the upper logical page but not both are programmed during a given programming cycle. U.S. patent application publication U.S. 2003/0112663 titled "Method and System for Programming and Inhibiting Multi-Level Non-Volatile Memory Cells", hereby incorporated by reference, describes programming all of the physical states of the page during one programming operation. In the case of four states per cell as shown in FIG. 8 all cells that will be programmed to any of the program states A, B, or C are first programmed to state A as described previously. After all cells to be programmed to any of these states are verified to have reached state A and since data for the upper states B and C already exist in the data latches DS1 and DS2 of FIG. 7, the programming cycle can continue without interruption or reloading of new data, and cells that should be programmed to states B and C can continue programming into state B. Once all cells reach this level, only those cells needing to C can continue into that state. As described in that patent application it is observed that some bits ("fast bits") program faster than others ("slow bits") and in practice some reduction in the wordline voltage is desirable when transitioning from programming into state B from state A and similarly from state B to state C. A typical voltage waveform incorporating this reduction in programming voltage is show in FIG. 11.

Although specific programming scheme has been described using FIG. 8B–8C, there are other possibilities that can be used. For example, U.S. Pat. No. 6,046,935 describes a programming method in which selected cells are programmed from state E to state B during a first programming cycle. During a second programming cycle cells are programmed from state E to state A and from state B to state C. U.S. Pat. No. 6,657,891 elaborates on this method by teaching that the initial distribution of state B may be allowed to extend to a lower threshold limit and even overlap final state A at the end of the first programming cycle, being tightened to its distribution as shown in FIG. 8C only during the second programming cycle. Furthermore, the binary coding adopted to represent states E, A, B and C may be chosen differently that that shown in FIG. 8A–C. Both U.S. Pat. Nos. 6,046,935 and 6,657,891 are hereby incorporated by reference.

Overlappped Programming of Data Portions in the Same Page

As described above, a unit of programming or "physical page" is composed of the cells that can be programmed concurrently. In the case of a multi-state memory, each physical page can store more than one logical page; the exemplary embodiment stores an upper logical page and a lower logical page in each physical page. In the two pass programming process of the prior art, once the lower page data assigned to a given physical page begins a programming operation, the process must be carried through to completion for a successful programming operation. Although the upper page data assigned to the same physical page may be present in the memory registers, the prior art does not allow the first programming pass to be interrupted and later restarted to include all of the data content for the physical page. Thus, although all of the data to be programmed into a given physical page may be present on the memory, the programming process cannot transition to a full programming sequence and the upper page data must wait until the lower page completes the programming process of the first pass.

In the prior art, it is also known that programming can be performed concurrently in multiple semi-autonomous memory arrays, know as planes (or quads), distributed across one or more memory chips, as is described in more detail in U.S. Pat. Nos. 5,890,192 and 6,426,893, which are hereby incorporated by reference. The memory may be either binary or multi-state. In this case, the physical page will consist of several planes and a programming operation will concurrently program a sector (or other amount of data) into each of these planes. If the data for some, but less than all, of the arrays has transferred to the memory, to program the full page the memory must wait for data for the rest of the page. Alternately, the memory can program the data it has in a partial page programming operation, where the missing portion is either not programmed or treated as if the data is all the erased state. Should additional data belonging to the page arrive during the partial page programming, the prior art does not allow the programming operation to be interrupted and restarted incorporating the additional data.

Both of these cases are similar in that a programming operation is started with less than the full amount of data that the physical page can contain. The situation can be conceptualized as subdividing the physical page in either the horizontal direction (into planes) or the vertical direction (upper and lower pages). When data is provided for less than all of the subdivisions, a partial programming based upon the available data can be started; but as the physical page forms a unit of programming, without provisions for interrupting and restarting programming, additional data cannot be incorporated except by using an additional, subsequent programming operation. A principal aspect of the present invention provides this capability.

In the upper page/lower page arrangement, this results in the overlapped programming of upper and lower multi-state memory pages. In the multi-plane case, this results in pipelined partial page programming. In exemplary embodiments of these two sub-aspects, the programming process uses a staircase programming waveform, such as shown in FIG. 9. When the additional data corresponding to a physical page undergoing a programming operation with less than the available content of the physical page (such as lower page or partial page programming), the programming operation is interrupted, the data content of the cells verified, and the programming operation is reset and recommenced incorporating the additional data.

Overlapped Programming of Upper and Lower MLC Pages

As described in the Background, when a physical page of MLC flash memory is being programmed with the lower page data, the user (controller) has to wait until the programming is finished to be able to start programming the upper page data, when in fact, both the lower and upper page data will eventually be programmed into the same physical page. This is shown in FIG. 10A for the exemplary 4-state cell embodiment.

In FIG. 10A, the first row (host transfers) show the transfer of data from the host to the controller 20 and the second row (flash transfers) shows the subsequent transfer of this data from the controller into the data storage portion 16. Each sector (or other unit of transfer) of the data to be programmed as the lower page is first transferred into the controller and then on to the memory. Once the entire lower page has been transferred, the lower page programming begins, where the third line in FIG. 12A shows which data is being programmed. Since the first programming pass of the lower page only programs from state E to state A, only this transition is shown as active (the 1E->A line). The E->A programming begins at time t1 and ends at time t3.

After the lower page data has been transferred from the controller to the memory, the upper page data is transferred to the controller and then on to the flash memory. The transfer occurs during the programming of the lower page and is completed at time t2. Although the upper page data is on the chip at time t2, as the prior art does not allow the lower page programming to be terminated before completion and then subsequently resumed, the upper page data cannot be programmed until time t3 when the lower page programming is complete. Beginning at time t3, the upper page data are then programmed as shown in FIG. 10A, with the A->B and E->C transitions active. The entire process ends at the time t4.

According to a first aspect of the present invention, once the upper page data is present on the memory the lower page programming is interrupted at time t2. The process is then resumed, programming both the lower and the upper page data at the same time. This eliminates the programming time between time t2 and time t3 that was devoted to the lower page data alone, and essentially reduces the programming time by this amount.

FIG. 10B shows additional detail for the process of FIG. 10A. The first line (Cache Busy) corresponds to an enable signal for transferring data. When it goes high after being low it indicates that there is a data register able to hold the next data, not that the programming is actually complete. The second line (True Busy) corresponds to what is actually happening inside the chip. The Cache Busy signal is high to load the lower page of data, before going low and then high again to load the upper page. It then stays low until subsequent data are loaded. Once the lower page is loaded, programming is enabled and the lower page is programmed. Since data is only being programmed to the lowest non-erased state, only the A state needs to be verified. Once all of the cells being programmed to the A state verify (or the maximum number of pulses is reached), the programming of the upper page begins. Initially, verification is only performed for the B state as the states undergoing the E->C transition will take longer to arrive at their target values. Eventually, it will be necessary to check both the B and C states, as indicated by pvfyB/C. Once the allotted number of pulses for the B state are finished, the cells with the B target state are locked out and only C state is verified until either all of the cells with C as their target state verify or the maximum number of pulses are reached.

In a first aspect of the present invention, the time between t2 and t3 (when the upper page data has been transferred to the memory but is not being programmed) in FIG. 10A is largely eliminated by allowing overlapped programming of upper and lower pages in a multi-state memory. This allows the memory to be programmed at its highest programming bandwidth under any circumstances. Thus, the controller need not wait for the lower page programming to be completed before it is ready to program the upper page with new data. A strategy of starting programming as soon as possible, based on this method, can significantly increase a multi-state memory's performance in applications, particularly where host writes in small clusters or non-contiguously.

Under the prior art arrangement, the limitations of FIG. 10A can be worked around only by using a Program with Cache type of command, where the lower page data is cached in the flash memory's data register until the upper page data is transferred, then both pages are programmed simultaneously. This solution maintains the maximum programming bandwidth for long, contiguous host write operations, but gives zero or negative advantage if the host writes in small clusters or non-contiguously. If the host does not write data sectors in long contiguous chunks and the expectation of the next data portion to be contiguous to the previous one is wrong, an additional delay results.

In this aspect of the invention, the method begins by starting the programming of the lower page before the upper page data is available. The programming operation can be stopped before the lower page programming is complete when upper page data is available. If the new data should be written to another physical page, then the controller only needs to wait for the end of the on-going lower page program operation; however, if the new data is the upper page data corresponding to the same physical page as the current lower page date being programmed, the status of the memory cells being programmed is verified and the memory's physical page can then be programmed with both the lower and the upper pages data in parallel. As a result, the controller can start lower page programming as soon as it can without possible performance penalty in the case where it needs to wait for the upper page's data. The method is illustrated schematically in FIGS. 11A–11C.

As in FIG. 10A, the process of FIG. 11A begins with the transfer of the lower page data from the host to the controller and then from the host to the memory, at which time (t1) the programming of the lower page data begins. Once the lower page data is transferred, the upper page data is transferred onto the memory, finishing at time t2. Until this point, the process is essentially the same as described with respect to FIG. 12.

Once the second set of data is received, it needs to be checked that it is for the upper page corresponding to the same physical cells of the memory as the lower page being programmed. More generally, it is checked to see that it corresponds to an additional set of data states stored in the same set of cells as those currently being programmed; for example, if three pages are stored on a physical page, it could be the middle page corresponding to the lower page going programming. When it is determined that the new upper page data is appropriate to be added to the currently programming lower page, a change to a "full sequence programming" is initiated. Full sequence programming means that two binary bits are being programmed simultaneously. While this increases the programming speed, it may require one or more additional verify steps after each programming pulse to determine when programming for each bit should be terminated. Initiating a change from lower page programming to full sequence programming requires that several conditions be examined. First, it must be determined if lower page programming is in fact complete or nearly complete. If so, the change to full sequence programming will not occur; lower page programming will complete in the normal fashion and programming will continue with upper page programming using the standard programming algorithms. Secondly, a change to full sequence programming will only occur at the completion of the current program verify cycle. For an embodiment using a staircase programming voltage waveform, such as that shown in FIG. 9, the new starting level of the programming voltage may need to be reset at time t2. The situation can be grouped into three cases: in the first case, if after receiving the upper page data it is found that the lower page data programming has finished, the upper page data is programmed using the standard second programming pass waveform for upper page data. In the second case, if the upper page data is present early enough and the lower page waveform has not progressed enough to exceed the starting point for the full sequence waveform, the waveform can continue to rise monotonically and transition into the full sequence waveform, although the maximum pulse number counter and other parameters may need to be reset. In the third case, where the lower page has not finished programming but the programming voltage waveform exceeds that starting full sequence value, the waveform will need to set back to start the full sequence routine as shown in FIG. 11B. This is necessary to ensure that any fast programming bits currently locked out from further lower page programming do not overshoot the desired next threshold state after the first full sequence programming voltage pulse.

FIG. 11B shows an example of a programming waveform for the process of FIG. 11A. FIG. 11A picks up the waveform at some point during the programming of the lower page data, with the cells in the physical page undergoing the standard first pass pulse/verify cycle. Event time t2 is taken to occur at some time around pulse 103 or the subsequent verification read. If pulse 103 should happen to correspond to the maximum number of pulses for first programming pass of the lower page, the process would subsequently continue with the standard second programming pass of the upper page. When pulse 103 is less than the maximum pulse number of the lower page, the process converts to full sequence programming in a multi-state programming mode. Any cells that have their final target state as the A state and have verified correctly will lock out, while all other cells will receive more programming. To avoid overshooting their target state, the exemplary embodiment starts the full sequence waveform at lower value than the maximum value of the lower page. In FIG. 11B, this is shown as pulse 105 that is less than the preceding pulse 103. Upon converting to full sequence programming, a number of waveform parameters can be changed. In addition to the starting Vpgm value, this includes the maximum Vpgm value, the maximum number of pulses, and the step size, where the example takes the full sequence step size as the same or lower page step size. These parameters can fixed or, preferably, settable.

If event t2 occurs prior to pulse 101, the lower page to full sequence conversion will occur before the pulse amplitude reaches the full sequence starting value of 105. In this case, the staircase can continue to rise by constant step levels until it reaches this level, with pulses between 101 and 105 removed and these two pulses basically coalescing and forming a single staircase such as that shown in FIG. 9. The various parameters associated with the lower page to full sequence conversion will also be reset.

FIG. 11C is the FIG. 11A embodiment equivalent of FIG. 10B. As in FIG. 10B, the first line (Cache Busy) corresponds to an enable signal for transferring data and indicates the loading of the lower page followed by loading the upper page, where the upper and lower pages correspond to the same physical page. The Cache Busy signal is high to load the lower page of data, before going low and then high again to load the upper page. It then stays low until subsequent data are loaded, here the lower page data on the next word line. Once the lower page is loaded, programming is enabled and the lower page is programmed, where the second line (True Busy) corresponds to programming being enabled.

While only the lower page is being programmed, only the A state needs to be verified, as indicated by pvfyA. Once the upper page data is loaded, the B state is also verified, as indicated by pvfyA/B. After the number of pulses allotted for the A state, programming can stop for any cells having the A state as their target state that have not verified and these can be dealt with by error correction methods. Sometime after the verification of the A state is discontinued, verification of the C state is added to the verification of the B state, as indicated by pvfyB/C. Once the allotted number of pulses for the B state have been used, only the C state continues to be verified as indicated by pvfyC. Line 41 indicates that when all cells are verified in state B and only programming of state C remains, new data for the next page can be received and occur while programming continues for state C. This is another embodiment of the invention to further improve programming time. Assuming the state coding referenced earlier in FIG. 8A, state B is represented as "00" and state C is represented as "01", and we know that if programming is continuing, upper page data for this cell is 0. Therefore we can release the upper page buffer register temporarily and load lower page data for the next page into this buffer (the data will be transferred to the lower page buffer when programming starts for the new page). Even if there is a program failure during the subsequent programming of state C and we need to rewrite the data, the controller does not need to transfer new data for page n to the memory; we still have the lower page data, and we can recover the upper page data by simply reading the state of the cell using a $V_{RB}$ threshold (see FIG. 10C). In this event, an error would be reported to the controller, the received data for lower page n+1 would be discarded, and the recovered data for page n would be written to a new location as directed by the controller. Using an alternate coding such as described in U.S. Pat. Nos. 6,046,935 or 6,657,891 referenced earlier would allow the lower page buffer to be released, but the basic principle remains the same.

Pipelined Partial Page Programming

As described in the Background, when a page in a flash or other memory is being partially programmed, for example a multi-sector or multi-plane page is programmed with only a single sector of data, the user (controller) has to wait until programming is finished to be able to start another partial program of the same page. This process is shown in FIG. 12.

The first two lines of FIG. 12 are similar to those in FIG. 10A, except that the units of transfer are portions of a page rather than the complete upper and lower page data. The unit of program, or (programming) page, is taken to consist of a plurality of such units of transfer, taken as a sector in this example, that can be programmed simultaneously. Each of these sectors that are combined into a page are taken as belonging to a separate semi-autonomous array, or plane, of the memory. The planes can all be on the same memory chip or distributed across multiple chips. The process of linking portions of several arrays together to form composite logical structures is described more fully in U.S. patent application Ser. Nos. 10/750,157 and 10/750,155, both filed Dec. 30, 2003, both of which are hereby incorporated by reference. The example of FIG. 12 assumes that that the memory system allows partial page programming, that up to four sectors can be programmed concurrently into four planes, and that the corresponding sectors are here labeled 0–3. In this aspect of the present invention, the memory cells may be binary or multi-level cells. In the case of multi-level data, data may be encoded as multi-state data belonging to a single logical page or in a multi-page format, such as the upper page/lower page arrangement described above. In the last case, the pipelined partial page programming aspects of the present invention described in this section can be combined with the overlapped programming of upper and lower pages described in the preceding section.

The bottom four lines of FIG. 12 show which planes are being programmed when and with which data. In the example, the host transfers sectors 0 and 1 one after the other and memory waits to accumulate both before beginning programming. If there is no immediate indication of more data to come, or the system otherwise decides not to wait for more data, at time t1 the partial page of sectors 0 and 1 starts programming into planes 0 and 1. The programming continues until the either all the cells verify or the maximum pulse number is reached.

While the partial page of sectors 0 and 1 is being programmed, the rest of the data corresponding to this page arrives, and sector 2 and sector 3 data are transferred to the memory at times t2 and t3, respectively. As the prior art does not allow for interrupting and later resuming programming before the programming is complete, the memory must wait until sectors 0 and 1 finish programming at time t4 before sector 2 and 3 data can be programmed into planes 2 and 3 in a second partial programming operation. While programming sectors 2 and 3, sectors 4–7 are transferred and can be programmed together as a whole page, starting at time t5 when the partial page programming of sectors 2 and 3 finishes. It should be noted that this sequence is just an example of the timing for when the different sectors are transferred; more generally, these considerations would apply any time there is a gap so that less all of the sectors that make up a complete page show up one right after another and, subsequently, additional sectors belonging to the page arrive while the partial page is still programming.

Although the data for sector 2 is present at time t2 and the data for sector 3 is present at time t3, according to the prior art the partial page of sectors 0 and 1 cannot be interrupted and then resumed in mid-course to include these additional portions of the page, but must finish at time t4 followed by a second partial page programming. A aspect of the present invention is a method allowing pipelining partial programming of memory pages in flash memory so that the memory can be programmed at its highest programming bandwidth under any circumstances. A particular strategy is to start programming as soon as possible, based on this method, can significantly increase system performance in applications where the host writes in small clusters or non-contiguously.

To deal with these problems in the prior art, there are different methods where the main idea is to collect as much data as possible for page programming. In this case the data for different sectors is cached in the controller buffer or memory data register until all the data for the page is collected for full page programming, so that for the transfers shown in FIG. 12 programming would not begin until all of sectors 0–3 have transferred, or the host writes a non-contiguous sector and the data should be written by a partial page programming. These solutions maintain the maximum programming bandwidth for long, contiguous host write operations, but give zero or negative advantage if the host writes in small clusters or non-contiguously. If host does not write data sectors in long contiguous chunks and the expectation of the next data portion to be contiguous to the previous one is wrong, this creates an additional delay. In addition, this method requires more buffer space if the controller collects all the data in the controller's buffer.

A first partial page programming begins with a first data portion, leaving some sectors blank. This first partial page programming begins before the next host command is received and when it is unknown whether the next command is a contiguous sector write. The first partial page programming operation can be stopped before completion if a subsequent command relates to data for the blank sectors of the page as soon as this new data portion is received. If the new data corresponds to another page, then the controller only needs to wait for the end of the on-going program operation. The status of the memory cells is then verified and the page can then be programmed with both the original and the new data in parallel. The memory can indicate a status for every sector/plane of the page being programmed, so that the controller can free up the buffer, which contains data for those sectors already programmed. The controller can start programming of the next sector in a plane independently from the on-going activity in the other planes and the multi-plane memory can start programming in those planes where programming is complete ahead of other planes.

According to these various sub-aspects, the controller can start first partial page programming operation as soon as it can without possible performance penalty in the case that it later wants to program more data to the same page. This also allows the controller to free up data buffers, which contained the data for the first portion, before the second portion data programming is finished. Further, if memory architecture allows, the controller can start another program operation in the inactive planes.

A first embodiment of a pipelined partial page programming operation is illustrated in the diagram of FIG. 13. Similarly to the process discussed above with respect to FIG. 11A, this first embodiment assumes that, for those parts of the page that have been interrupted, the programming cycle can be restarted at the same point. This could be the case, for example, when a pulsed programming waveform having a constant pulse amplitude is used or when a constant bias is applied for programming. It could also apply to a staircase programming waveform, such as shown in FIG. 9, where each plane can have its own staircase. (The case of a staircase programming waveform where all of the planes share the same waveform is described below with respect to FIGS. 14A and 14B.)

Prior to time t1 in FIG. 13, data for sectors 0 and 1 are received by the controller. The controller reports that command's execution was successful (Write Cache is enabled) and that it is ready for another command. Sectors 0 and 1 are transferred to the 4-plane flash memory. Partial page programming then starts, where planes 0 and 1 will correspondingly be programmed with sector 0 and 1 data, and planes 2 and 3 will either be programmed with blank data (FF's) or will not be programmed at all. The invention applies to a 4-sector single plane memory, where FFs should be programmed. Even in a single plane device the programming circuit can provide information about which group of cells (for example, sectors) are programmed, so that the buffer containing the data of those cells can be released.

At time t2, data for sector 2 are received by a new command (as in the other examples this can be any sector, which is going to be written subsequently to the sectors 0 and 1 as part of the same page). The controller reports successful command execution and sector 2 is transferred to the flash memory. The physical page programming is stopped and the physical page's state is verified so that the correct programming mode (for example, coarse or fine) can be chosen later for every cell. Partial page programming then resumes, where planes 0, 1 and 2 will be programmed with sector 0, 1 and 2 data, correspondingly, and plane 3 will either be programmed with blank data (FF's) or will not be programmed at all. One implementation of a coarse/fine programming mode is disclosed in U.S. Pat. No. 6,643,188, hereby incorporated by reference.

At time t3, data for sector 3 is received by a new command. The controller does not report a successful command execution, as no data buffers are available. Sector 3 is transferred to the flash memory. The physical page programming is again stopped and the physical page's state is verified so that the correct programming mode can be chosen later for every cell. Full page programming can then start, where planes 0, 1, 2 and 3 will be programmed with sector 0, 1, 2 and 3 data correspondingly.

In this embodiment, at time t4, the programming of sector data 0 and 1 into planes 0 and 1 finishes, the controller frees up the buffers which contained data for sectors 0 and 1, and the controller reports successful execution of the last command. After time t4 and prior to time t5, data for sectors 4 and 5 are received by the controller and are transferred to the 4-plane flash memory. If the memory allows independent plane programming, then programming of planes 0 and 1 can start, where planes 0 and 1 will be programmed with data for sectors 4 and 5 correspondingly, and planes 2 and 3 will still be programmed with blank data (FF's) or will not be programmed at all. If memory planes cannot be programmed independently, then physical page programming can be stopped, the physical page's state verified so that the correct programming mode can be chosen later for every cell, and the programming for all planes started with data for sectors 2, 3, 4 and 5.

Prior to the time t6, the programming of plane 2 finishes, the controller frees up the buffer which contained data for sector 2 and the controller reports a successful execution of the last command. Data for sector 6 is subsequently received by the controller. The controller does not report a successful command execution as no the data buffers are available. Sector 6 is transferred to the flash memory. If memory allows independent plane programming, then plane 2 programming starts with sector 6 data, and planes 0, 1 and 3 will restart programming with sectors 4, 5, and 3 data respectively. If memory planes cannot be programmed independently, then physical page programming should be stopped, the physical page's state verified so that the correct programming mode can be chosen later for every cell, and the programming for all planes started with data for sectors 3, 4, 5 and 6.

At time t7, programming of plane 3 finishes and the controller can free up the buffer with data for sector 3. If programming of sectors 4, 5, and 6 has not been started yet, then partial page programming can start, where planes 0, 1, and 2 will be programmed with sector 4, 5, and 6 data correspondingly, and plane 3 will either be programmed with blank data (FF's) or will not be programmed at all. At time t8, sector 7 data is received by a new command. The controller does not report successful command execution as no data buffers are available. Sector 7 is transferred to the flash memory. Physical page programming is stopped and its state is verified so that the correct programming mode can be chosen later for every cell. Full programming starts, where planes 0, 1, 2 and 3 will be programmed with sector 4, 5, 6 and 7 data, correspondingly.

FIGS. 14A and 14B illustrate a second embodiment for pipelined partial page programming. This embodiment differs from that of FIG. 13 in that it covers the case where the programming process needs to be reset when programming is resumed with data for an additional portion of the page added. This occurs in an architecture where all of the planes in the physical page share the same programming voltage ($V_{pgm}$) and the programming waveform is a staircase like that in FIG. 9. In this arrangement, once a word line programming cycle in any of the planes has begun, it can be terminated incompletely, but if additional data is added in another plane of the physical page $V_{pgm}$ will need to be reset for the new data. Consequently, it will also be reset in the rest of the physical page as the same charge pump supplies the entire word line. In this arrangement, programming sector 1, say, will not necessarily finish ahead of sector 2, as is shown in FIG. 13. In the embodiment of FIGS. 14A and 14B, when the programming is interrupted, $V_{pgm}$ is reset and the data registers are reset by reading the state of the incompletely programmed cells. In many of these details, the embodiment of FIGS. 14A and 14B relates to the embodiment of FIG. 13 in much the same way as the embodiment of FIGS. 11A–11C relates to the embodiment of FIG. 10.

Until time t2, the process of FIG. 14A is the same as in FIG. 13. Once sector 2 data is transferred, the current cycle of the pulse/verify process is completed, the states of the cells are verified, and the programming waveform is reset. The resetting starts the $V_{pgm}$ waveform at time t2 at the same level as it started at time t1. Any appropriate parameters associated with the process, such as the maximum number of pulses, are also reset. Consequently, if the data for sector 3 were not to arrive soon enough, the programming of sectors 0 and 1 would now finish together with the programming of sector 2 at some time earlier than t7.

In the example, however, sector 3 data arrives and is transferred at time t3. Programming of the partial page of planes 0–2 is interrupted, the programming process is again reset as at time t2, and programming resumes with the full page. Due to the resetting, the full page finishes at time t7. This allows the programming of each sector to begin in a pipelined, partial page process as soon as the data is available. Rather than both of sectors 2 and 3 waiting until time t4 to begin programming, they can respectively start at t2 and t3.

While sectors 0–3 are programming, sectors 4 and 5 are transferred by time t5, with sector 6 transferred by time t6. Once the first page finishes at time t7, partial page programming of planes 0–2 with respective sector data 4–6 begins, following the same process as the first page. This assumes buffer space is available before sectors 0–3 finish programming. If not, as soon as the programming of this first page finishes, sectors 4–6 are then transferred subsequent to event time t4. Once they are on the memory, the programming of the partial page of sectors 4–6 into planes 0–2 begins. When sector 7 data arrives, the partial page programming of planes 0–2 is interrupted, the process reset, and full page programming resumes at event time t8.

FIG. 14B is an exemplary waveform for the process of FIG. 14A from time t1 up to some time around time t5. The $V_{pgm}$ waveform starts as for that of FIG. 9 and is used for the partial (logical) page of sectors 0 and 1 to be programmed into the partial (physical) page of planes 0 and 1. Additional data for sector 2 shows up at some time in the pulse/verify cycle associated with pulse 201. The programming is interrupted, the state of the cells determined, and programming reset and restarted for sectors 0–2. Similarly, when the remaining data for the page shows up some time in the pulse/verify cycle associated with pulse 205, the partial page programming is interrupted and restarted at 207 with the full page, and so on in what is now a standard, full page programming process.

In all of the forgoing embodiments, both for pipelined partial page programming and for overlapped programming of upper and lower MLC pages (that is, for both the "horizontal" and "vertical" implementations of overlapped programming of data portions in the same page), it should be noted that the usage of "current programming operations" or, more briefly, "concurrently programming" does not necessarily imply that all programming pulses for all the data within a page are absolutely simultaneous. This also applies to the case when a page spans multiple planes (a "meta-page"). For example, in the case where a meta-page spans multiple chips, the programming pulses of the programming operation in the first chips maybe started first, followed by those for the same programming operation in the second chip. Such wide-meta-pages are used in some multi-chip parallel configurations for convenience. Among the areas where these may provide advantages are: address translation; in minimizing overhead if the programming parts of a meta-page is not simultaneous, but the program pulses can be started one after another in a shorter time if enough data is collected for multiple programs (in an extreme case, data may be programmed bit by bit inside the memory chip); and/or minimize power consumption.

Alternate use of Dielectric Storage Elements

The forgoing examples of flash EEPROM memory cells have been described with respect to the type of cell that utilizes conductive floating gates as charge storage elements. However, the various aspects of the present invention can be used in conjunction with the various memory technologies described in U.S. patent application Ser. No. 10/841,379 filed May 7, 2004, which is hereby incorporated by reference. For example, the invention may also be implemented in a system that uses a charge trapping dielectric as the storage elements in individual memory cells in place of floating gates. The dielectric storage element is sandwiched between a conductive control gate and the substrate within the cell's channel region. Although the dielectric can be separated into individual elements with the same sizes and positions as the floating gates, it is usually not necessary to do so since charge is trapped locally by such a dielectric. The charge trapping dielectric can extend over the entire array except in areas occupied by the select transistors or the like.

Dielectric storage element memory cells are generally described in the following technical articles and patent, which articles and patent are incorporated herein in their entirety by this reference: Chan et al., "A True Single-Transistor Oxide-Nitride-Oxide EEPROM Device," *IEEE Electron Device Letters*, Vol. EDL-8, No. 3, March 1987, pp. 93–95; Nozaki et al., "A 1-Mb EEPROM with MONOS Memory Cell for Semiconductor Disk Application," *IEEE Journal of Solid State Circuits*, Vol. 26, No. 4, April 1991, pp. 497–501; Eitan et al., "NROM: A Novel Localized Trapping, 2-Bit Nonvolatile Memory Cell," *IEEE Electron Device Letters*, Vol. 21, No. 11, November 2000, pp. 543–545, and U.S. Pat. No. 5,851,881.

There are two specific charge trapping dielectric materials and configurations that are practical for use. One is a three-layer dielectric with silicon dioxide initially grown on the substrate, a layer of silicon nitride deposited thereover and another layer of silicon oxide, grown and/or deposited, over the silicon nitride layer ("ONO"). A second alternative is a single layer of silicon rich silicon dioxide sandwiched between the gate and the semiconductor substrate surface. This later material is described in the following two articles, which articles are incorporated herein in their entirety by this reference: DiMaria et al., "Electrically-alterable read-only-memory using Si-rich $SiO_2$ injectors and a floating polycrystalline silicon storage layer," *J. Appl. Phys.* 52(7), July 1981, pp. 4825–4842; Hori et al., "A MOSFET with Si-implanted Gate-$SiO_2$ Insulator for Nonvolatile Memory Applications," IEDM 92, April 1992, pp. 469–472. Dielectric storage elements are also discussed further in the U.S.

patent application Ser. No. 10/280,352, filed Oct. 25, 2002, which is hereby incorporated by this reference.

Although the present invention has been described in terms of specific examples and variations thereof, it is understood that the invention is to be protected within the full scope of the appended claims.

What is claimed is:

1. A method of programming a non-volatile memory, wherein during a programming operation data is written into a plurality of multi-state storage units formed into a physical page, the method comprising:
    receiving first data content assigned to a physical page, wherein the first data content specifies less than all of the data content storable for storage units of the physical page;
    beginning a programming operation of the first data content to the physical page;
    subsequent to said receiving the first data content and prior to completing said programming operation of the first data content, receiving additional data content for said storage units of the physical page;
    subsequent to said receiving additional data content and prior to completing said programming operation of the first data content, interrupting the programming operation of the first data content; and
    beginning a concurrent programming operation of the first data content and the additional data content to the physical page.

2. The method of claim 1, wherein the first data content is a lower data page and the additional content is an upper data page.

3. The method of claim 1, further comprising:
    prior to interrupting the programming operation of the first data content, determining that the additional data content is assigned to the same physical page as the first data content.

4. The method of claim 1, further comprising:
    subsequent to interrupting the programming operation of the first data content and prior to beginning the concurrent programming operation of the first data content and the additional data content, verifying the state of the storage units of the physical page.

5. The method of claim 4, further comprising:
    subsequent to interrupting the programming operation of the first data content and prior to beginning the concurrent programming operation of the first data content and the additional data content, resetting one or more programming parameters.

6. The method of claim 5, wherein said programming operations use a programming waveform comprising a series of pulses of increasing magnitude.

7. The method of claim 6, wherein said one or more programming parameters include amplitude of the programming waveform.

8. The method of claim 6, wherein said one or more programming parameters include the maximum number of pulses.

9. The method of claim 6, further comprising:
    subsequent to interrupting the programming operation of the first data content and prior to beginning the concurrent programming operation of the first data content and the additional data content, verifying the state of the storage units of the physical page, wherein said programming parameters are set based upon said state of the storage units.

10. The method of claim 1, wherein said programming operation of the first data content to the physical page includes writing blank data for the non-specified data content of the physical page.

11. The method of claim 1, further comprising:
    subsequent to said receiving the first data content and prior to completing the concurrent programming operation of the first data content and the additional data content to the physical page, starting another programming operation in a portion of the memory outside of said physical page.

12. A method of programming a non-volatile memory, wherein during a programming operation data is written into a physical page having a plurality of storage units, the method comprising:
    receiving first data content assigned to a physical page, wherein the first data content specifies data content for less than all of the storage units forming the physical page;
    beginning a programming operation of the first data content to the physical page;
    subsequent to said receiving first data content and prior to completing said programming operation of the first data content, receiving additional data content for one or more additional storage units of the physical page for which data is not specified by the first data content;
    subsequent to said receiving additional data content and prior to completing programming operation of the first data content, interrupting the said programming operation of the first data content; and
    subsequently beginning a concurrent programming operation of the first data content and the additional data content to the physical page.

13. The method of claim 12, wherein said page comprises multiple sectors, wherein said first data content comprises one or more, but less than all, sectors of the page, and the additional data content comprises one or more sectors of the page.

14. The method of claim 12, wherein said physical page is distributed across multiple planes of said non-volatile memory.

15. The method of claim 12, further comprising:
    prior to interrupting the programming operation of the first data content, determining that the additional data content is assigned to the same physical page as the first data content.

16. The method of claim 12, further comprising:
    subsequent to interrupting the programming operation of the first data content and prior to beginning the concurrent programming operation of the first data content and the additional data content, verifying the state of the storage units of the physical page.

17. The method of claim 16, further comprising:
    subsequent to verifying the state of the storage units of the physical page and prior to beginning the concurrent programming operation of the first data content and the additional data content, resetting one or more programming parameters.

18. The method of claim 17, wherein said programming operations use a programming waveform comprising a series of pulses of increasing magnitude.

19. The method of claim 18, wherein said one or more programming parameters includes amplitude of the programming waveform.

20. The method of claim 18, wherein said one or more programming parameters includes the maximum number of pulses.

21. The method of claim 12, wherein said programming operation of the first data content to the physical page includes writing blank data for the storage units of the physical page for which data is not specified.

22. The method of claim 12, further comprising:
subsequent to said receiving the first data content and prior to completing the concurrent programming operation of the first data content and the additional data content to the physical page, starting another programming operation in a portion of the memory outside of said physical page.

23. A method of programming a non-volatile memory, wherein during a programming operation data is written into a plurality of storage units, the method comprising:
receiving first data content assigned to said plurality of storage units, wherein the first data content specifies data content for less than all of the data content that said storage units can contain;
beginning a programming operation of the first data content to said plurality of storage units;
subsequent to said receiving first data content and prior to completing said programming operation of the first data content, receiving additional data content that can be contained by said plurality of storage units;
subsequent to said receiving additional data content and prior to completing programming operation of the first data content, interrupting the said programming operation of the first data content; and
subsequently beginning a concurrent programming operation of the first data content and the additional data content to said plurality of storage units.

24. The method of claim 23, wherein said plurality of storage units are multi-state storage units and are formed into a physical page storing a plurality of logical pages and wherein the first data content specifies data content for less than all of said plurality of pages.

25. The method of claim 23, wherein said first data content specifies data content for less than all of said storage units and said additional data content specifies data content for one or more additional ones of said storage units for which data is not specified by the first data content.

26. The method of claim 23, further comprising:
subsequent to interrupting the programming operation of the first data content and prior to beginning the concurrent programming operation of the first data content and the additional data content, verifying the state of the plurality of storage units.

27. The method of claim 26, further comprising:
subsequent to verifying the state of plurality of storage units and prior to beginning the concurrent programming operation of the first data content and the additional data content, resetting one or more programming parameters.

28. The method of claim 27, wherein said programming operations use a programming waveform comprising a series of pulses of increasing magnitude.

29. The method of claim 28, wherein said one or more programming parameters includes amplitude of the programming waveform.

30. The method of claim 28, wherein said one or more programming parameters includes the maximum number of pulses.

31. The method of claim 23, wherein said programming operation of the first data content to said plurality of storage units includes writing blank data for the non-specified data content of said storage units.

32. The method of claim 23, further comprising:
subsequent to said receiving the first data content and prior to completing the concurrent programming operation of the first data content and the additional data content to said plurality of storage units, starting another programming operation in a portion of the memory not containing of said plurality of storage units.

33. A method of operating a non-volatile memory, wherein data is concurrently programmable from multiple data buffers into a plurality of storage units formed into a physical page, the method comprising:
performing a programming operation where data is written from a plurality of said buffers into said physical page;
verifying that the data content of storage units corresponding to one or more, but less than all, of said plurality of buffers is successfully written;
continuing said programming operation for the storage units corresponding to ones of said plurality of buffers other than those corresponding to storage units whose content is verified as successfully written; and
concurrently with said continuing said programming operation, receiving new data content into the buffers corresponding to storage units whose content is verified as successfully written.

34. The method of claim 33, wherein said storage units store binary data.

35. The method of claim 33, wherein said storage units store multi-state data.

36. The method of claim 33, wherein said physical page is distributed across multiple planes of said non-volatile memory.

37. The method of claim 33, wherein each of said buffers stores one or more sectors of data.

* * * * *